US010734980B2

(12) United States Patent
Jensen et al.

(10) Patent No.: US 10,734,980 B2
(45) Date of Patent: Aug. 4, 2020

(54) PULSE CHARGING SYSTEM

(71) Applicant: Fermi Research Alliance, LLC, Batavia, IL (US)

(72) Inventors: Chris Jensen, Downers Grove, IL (US); Howard Pfeffer, Glen Ellyn, IL (US); Kenneth Quinn, Geneva, IL (US); Matthew Kufer, Elburn, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 0 days.

(21) Appl. No.: 15/993,923

(22) Filed: May 31, 2018

(65) Prior Publication Data

US 2019/0372564 A1     Dec. 5, 2019

(51) Int. Cl.
*H03K 3/57* (2006.01)
*H02M 3/158* (2006.01)

(52) U.S. Cl.
CPC .............. *H03K 3/57* (2013.01); *H02M 3/1582* (2013.01)

(58) Field of Classification Search
CPC .. H02M 3/155–1588; H03K 3/53; H03K 3/57
See application file for complete search history.

(56) References Cited

U.S. PATENT DOCUMENTS

| 3,119,968 | A | | 1/1964 | Schonberg | |
|---|---|---|---|---|---|
| 3,363,184 | A | | 1/1968 | Smith | |
| 3,486,043 | A | | 12/1969 | Johannessen | |
| 3,675,116 | A | | 7/1972 | Israel | |
| 4,064,407 | A | | 12/1977 | Kelleher | |
| 5,347,209 | A | | 9/1994 | Payne | |
| 5,402,060 | A | | 3/1995 | Erisman | |
| 5,448,580 | A | * | 9/1995 | Birx | H01F 27/22 372/37 |
| 6,037,755 | A | * | 3/2000 | Mao | H02M 3/1582 323/222 |
| 6,677,736 | B1 | * | 1/2004 | Barnes | H03F 1/0211 323/280 |
| 2002/0000795 | A1 | * | 1/2002 | Wittenbreder, Jr. | H02M 3/158 323/271 |
| 2008/0129219 | A1 | * | 6/2008 | Smith | H02M 3/1582 315/291 |
| 2013/0154594 | A1 | * | 6/2013 | Zipperer | H02M 3/157 323/282 |
| 2015/0214847 | A1 | * | 7/2015 | Shimada | H02J 7/0052 320/107 |

(Continued)

OTHER PUBLICATIONS

Pfeffer, H., Frolov, D., Jensen, C. C., Kufer, M. E., and Quinn, K. High Burst Rate Charging System for the Lithium Lens Power Supply. United States: N. Jul. 2018. (Year: 2018).*

*Primary Examiner* — Thienvu V Tran
*Assistant Examiner* — Peter M Novak
(74) *Attorney, Agent, or Firm* — Loza & Loza LLP; Kevin L. Soules (57) ABSTRACT

A system, method, and apparatus for pulsed charging applications comprises a bulk capacitor operably connected to a power source, an inductor connected to the bulk capacitor with a charge switch, a pulse capacitor connected to the inductor, a freewheeling diode connecting a point between the charge switch and the inductor to a point after the pulse capacitor, a second diode connecting the inductor to the pulse capacitor, and a pulse switch connecting the pulse capacitor to a load.

17 Claims, 8 Drawing Sheets

(56) References Cited

U.S. PATENT DOCUMENTS

2016/0241162 A1* 8/2016 Yamakawa ............ H02M 3/158
2018/0375320 A1* 12/2018 Ho ......................... H02H 3/202
2019/0109530 A1* 4/2019 Perreault ............... H02M 3/158

* cited by examiner

PULSE CHARGING SYSTEM

STATEMENT OF GOVERNMENT RIGHTS

The invention described in this patent application was made with Government support under the Fermi Research Alliance, LLC, Contract Number DE-AC02-07CH11359, awarded by the U.S. Department of Energy. The Government has certain rights in the invention.

TECHNICAL FIELD

Embodiments are generally related to the field of charging. Embodiments are further related to the field of pulse charging. Embodiments are also related to methods, systems, and devices for high burst rate, and low average rate pulse charging systems.

BACKGROUND

Modern technology has resulted in a number of applications requiring pulsed power. In prior art approaches, a DC power supply is used to charge a bulk capacitor. When the bulk capacitor discharges during a "burst", the bulk capacitor discharges so much that the pulsed capacitor bank is charged to different voltages. Thus, to maintain regulation, excessive energy must be dissipated, commonly in a resistor. Prior art approaches essentially control or modify the quality factor of the circuit by adding loss.

Typical prior art solutions include the use of a charging supply to recharge the bulk capacitor in between load pulses. When a burst of pulses is required, this results in a large peak power requirement from the line, and a resulting higher cost and unnecessary waste of energy.

Accordingly, there is a need in the art for systems and methods that provide high burst rate, low average rate, pulse charging as disclosed herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method, system, and apparatus for charging.

It is another aspect of the disclosed embodiments to provide a method, system, and apparatus for charging a capacitor bank.

It is another aspect of the disclosed embodiments to repetitively charge a capacitor bank to a precise level.

It is another aspect of the disclosed embodiments to provide pulsed discharges to a load from a precisely charged capacitor bank.

It is yet another aspect of the disclosed embodiments to provided pulsed discharges to a load from a precisely, losslessly charged capacitor bank.

It will be appreciated that the methods and systems can be achieved according to the embodiments disclosed herein. In one such embodiment, a system, method, and/or apparatus comprises a bulk capacitor operably connected to a power source, an inductor can be connected to the bulk capacitor with a charge switch. A freewheeling diode can connect a point between the charge switch and the inductor, to a point after the pulse capacitor. A pulse capacitor can be connected to the inductor with a second diode. A pulse switch connects the pulse capacitor to a load. A current measurement device can be included to measure a current between the charge switch and the inductor, and a voltage measurement device can be used to measure voltage across the pulse capacitor.

A regulator can be configured to receive the current measurement from the current measuring device, and the voltage measurement from the voltage measurement device and operate the charge switch according to a resonant cycle. The charge switch operation can occur when energy in the inductor, added to energy in the pulse capacitor, equals a total desired energy in the pulse capacitor.

In an embodiment, the system further comprises a second inductor and a recovery switch wherein operating the recovery switch reverses a voltage on the pulse capacitor.

In another embodiment, the system further comprises a resistor following the inductor and a DeQ (or "dump") switch configured after the resistor. The regulator can be used such that charge switch operation occurs when an energy in the inductor, added to energy in the pulse capacitor, is more than a total desired energy in the pulse capacitor. The DeQ switch operation can occur when the measured voltage on the pulse capacitor is equal to a desired voltage on the pulse capacitor In certain embodiments, the load further comprises an application requiring a pulsed input.

BRIEF DESCRIPTION OF THE FIGURES

The accompanying figures, in which like reference numerals refer to identical or functionally-similar elements throughout the separate views, which are incorporated in and form a part of the specification, further illustrate the embodiments and, together with the detailed description, serve to explain the embodiments disclosed herein.

DETAILED DESCRIPTION

The particular values and configurations discussed in the following non-limiting examples can be varied, and are cited merely to illustrate one or more embodiments, and are not intended to limit the scope thereof.

Example embodiments will now be described more fully hereinafter, with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Figure 1:
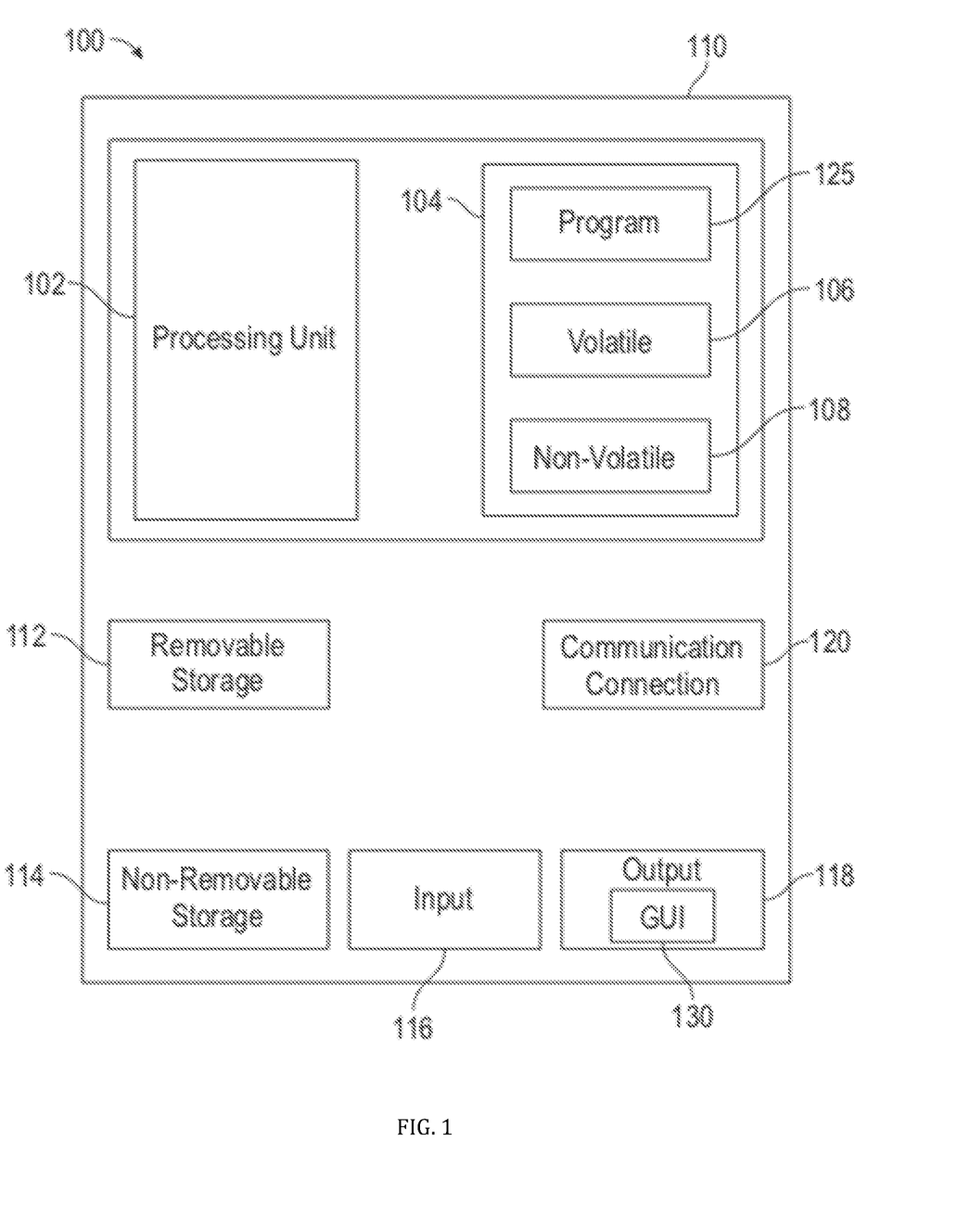
FIG. 1 depicts a block diagram of a computer system which is implemented in accordance with the disclosed embodiments.
Figure 2:
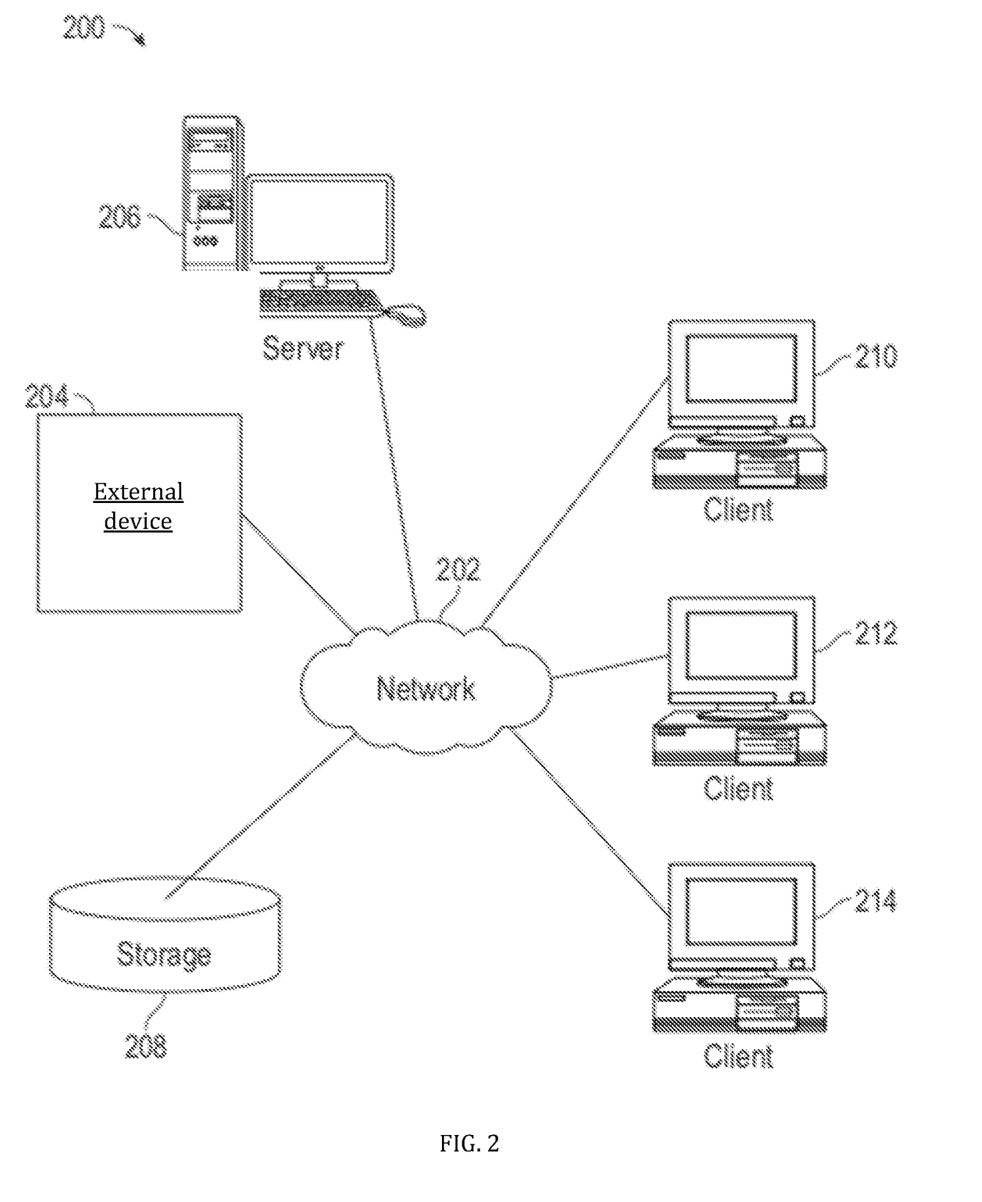
FIG. 2 depicts a graphical representation of a network of data-processing devices in which aspects of the present embodiments may be implemented.
Figure 3:
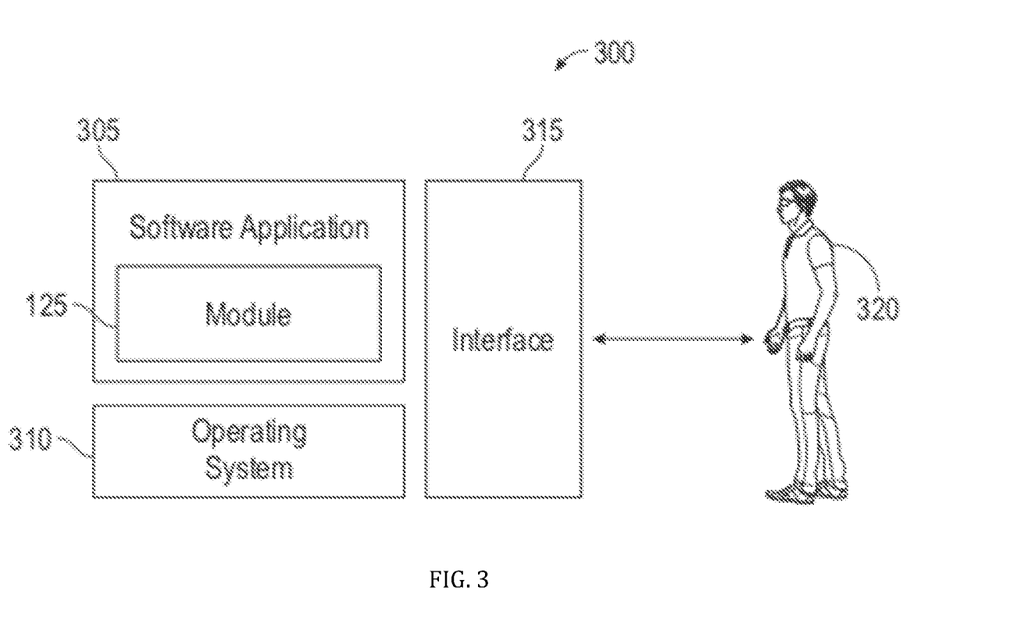
FIG. 3 illustrates a computer software system for directing the operation of the data-processing system depicted in FIG. 1, in accordance with an example embodiment.

FIGS. 1-3 are provided as exemplary diagrams of data-processing environments in which embodiments of the present invention may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing parts of the methods and systems disclosed herein is shown in FIG. 1. A computing device in the form of a computer 110 configured to interface with controllers, peripheral devices, and other elements disclosed herein may include one or more processing units 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data including image data.

Computer 110 may include, or have access to, a computing environment that includes input 116, output 118, and a communication connection 120. The computer may operate in a networked environment using a communication connection 120 to connect to one or more remote computers, remote sensors and/or controllers, detection devices, handheld devices, multi-function devices (MFDs), speakers, mobile devices, tablet devices, mobile phones, Smartphone, or other such devices. The remote computer may also include a personal computer (PC), server, router, network PC, RFID enabled device, a peer device or other common network node, or the like. The communication connection may include a Local Area Network (LAN), a Wide Area Network (WAN), Bluetooth connection, or other networks. This functionality is described more fully in the description associated with FIG. 2 below.

Output 118 is most commonly provided as a computer monitor, but may include any output device. Output 118 and/or input 116 may include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user, and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse, and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module or node 125, which can be representative of other modules or nodes described herein, are stored on a computer-readable medium and are executable by the processing unit 102 of computer 110. Program module or node 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 can be a network of computers or other such devices, such as mobile phones, smart phones, sensors, controllers, speakers, tactile devices, and the like, in which embodiments of the present invention may be implemented. Note that the system 200 can be implemented in the context of a software module such as program module 125. The system 200 includes a network 202 in communication with one or more clients 210, 212, and 214. Network 202 may also be in communication with one or more devices 204, servers 206, and storage 208. Network 202 is a medium that can be used to provide communications links between various devices and computers connected together within a networked data processing system such as computer system 100. Network 202 may include connections such as wired communication links, wireless communication links of various types, and fiber optic cables. Network 202 can communicate with one or more servers 206, one or more external devices such as device 204, and a memory storage unit such as, for example, memory or database 208. It should be understood that device 204 may be embodied as a detector device, controller, receiver, transmitter, transceiver, transducer, driver, signal generator, or other such device.

In the depicted example, device 204, server 206, and clients 210, 212, and 214 connect to network 202 along with storage unit 208. Clients 210, 212, and 214 may be, for example, personal computers or network computers, handheld devices, mobile devices, tablet devices, smart phones, personal digital assistants, printing devices, recording devices, speakers, MFDs, etc. Computer system 100 depicted in FIG. 1 can be, for example, a client such as client 210 and/or 212 and/or 214.

Computer system 100 can also be implemented as a server such as server 206, depending upon design considerations. In the depicted example, server 206 provides data such as boot files, operating system images, applications, and application updates to clients 210, 212, and/or 214. Clients 210, 212, and 214 and device 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet, with network 202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) or node(s) 125, may be "loaded" (i.e., transferred from removable storage 114 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that elements of the disclosed methods and systems may be practiced with other computer system configurations such as, for example, handheld devices, mobile phones, smart phones, tablet devices multi-processor systems, microcontrollers, printers, copiers, fax machines, multi-function devices, data networks, microprocessor-based or programmable consumer electronics, networked personal computers, minicomputers, mainframe computers, servers, medical equipment, medical devices, and the like.

Note that the term "module" or "node" as utilized herein may refer to a collection of routines and data structures that perform a particular task or implements a particular abstract data type. Modules may be composed of two parts: an interface, which lists the constants, data types, variables, and routines that can be accessed by other modules or routines; and an implementation, which is typically private (accessible only to that module) and which includes source code that actually implements the routines in the module. The term module may also simply refer to an application such as a computer program designed to assist in the performance of a specific task such as word processing, accounting, inventory management, etc., or a hardware component designed to equivalently assist in the performance of a task.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" system. It can be appreciated, of course, that other types of systems are possible. For example, rather than a traditional "windows" system, other operation systems such as, for example, a real-time operating system (RTOS) more commonly employed in wireless systems may also be employed with respect to operating system 310 and interface 315. The software application 305 can include, for example, module (s) 125, which can include instructions for carrying out steps or logical operations such as those shown and described herein.

The following description is presented with respect to embodiments of the present invention, which can be embodied in the context of, or require the use of, a data-processing system such as computer system 100, in conjunction with program module 125, and data-processing system 200 and network 202 depicted in FIGS. 1-3. The present invention, however, is not limited to any particular application or any particular environment. Instead, those skilled in the art will find that the system and method of the present invention may be advantageously applied to a variety of system and application software including database management systems, word processors, and the like. Moreover, the present invention may be embodied on a variety of different platforms including Windows, Macintosh, UNIX, LINUX, Android, Arduino and the like. Therefore, the descriptions of the exemplary embodiments, which follow, are for purposes of illustration and not considered a limitation.

As used herein a "burst" refers to a group of pulses at a given repetition rate followed by a delay. A series of bursts can include a group of pulses at a given repetition rate followed by a delay and then another group of pulses occurring iteratively. "Burst rate" refers to the repetition rate of pulses during the burst. An average rate refers to the total number of pulses per second in a burst.

The embodiments disclosed herein describe methods and systems for changing the quality factor of a circuit either with or without loss, which may be referred to herein as "DeQ."

Figure 4:
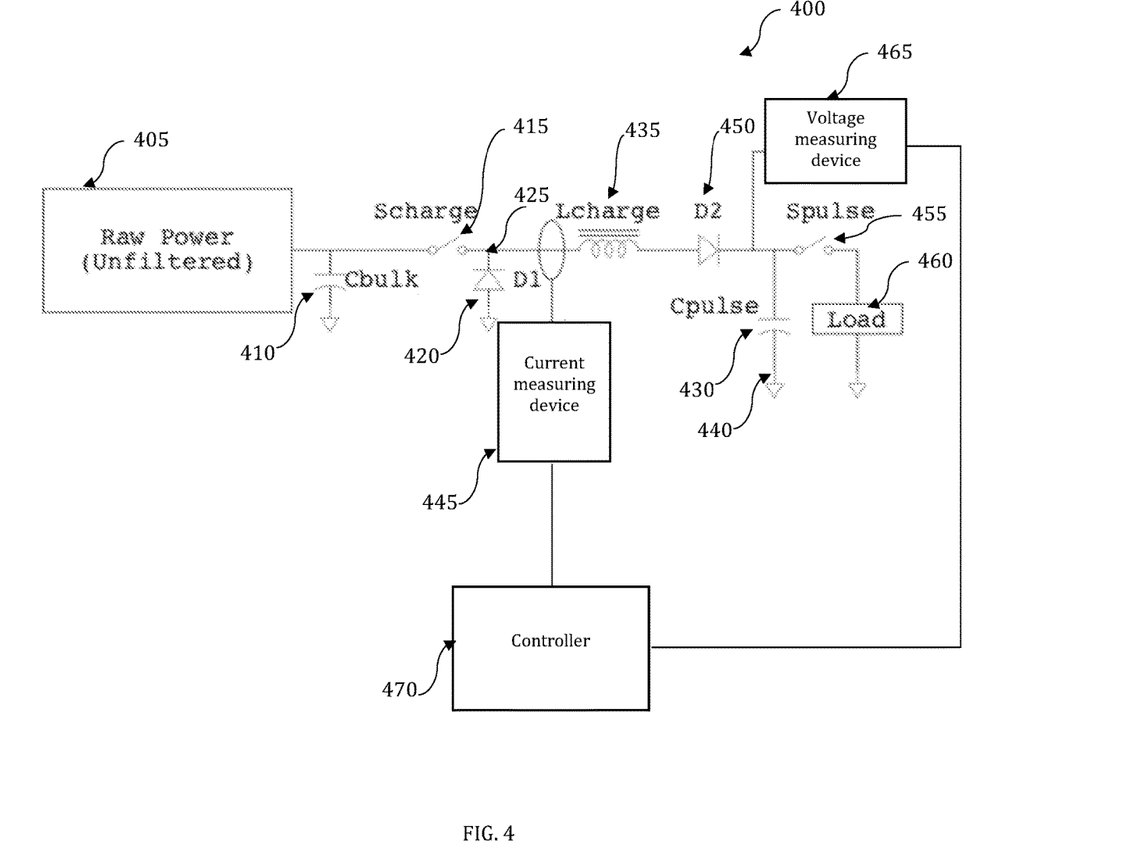
FIG. 4 depicts a block diagram of a system for supplying charged pulses in accordance with the disclosed embodiments.

In a first embodiment, DeQ can be achieved predictively with a system 400 illustrated in FIG. 4. As shown in FIG. 4, a power source 405 can provide power to a bulk capacitor 410. It should be understood that the power source 405 can comprise any standard power source and can be unfiltered. In certain the embodiments the power source 405 can comprise a standard DC power supply. In other embodiments, other power supplies can be used.

The bulk capacitor 410 comprises a passive energy storage component that is charged by the power source 405. In certain embodiments, the bulk capacitor can comprise a polarized capacitor with a capacitance that exceeds that of the pulse capacitor 430 further described herein. The discharge of bulk capacitor 410 is permitted by charge switch 415.

The charge switch 415 is crucial to the predictive functionality of the system 400. The charge switch 415 can be controlled by a controller or regulator, which can comprise a software or hardware associated with a computer system. The charge switch 415 is configured to open at a specific point in time that allows the pulse capacitor 430 to finish charging to its desired voltage at the end of the charging cycle. This is further detailed herein.

A freewheeling diode 420 connects a point 425 between the charge switch 415 and the inductor 435 to a point 440 after the pulse capacitor 435. The freewheeling diode 420 permits the charging of pulse capacitors 430 to continue after the charge switch 415 is open. Current measuring device 445 is used to monitor the current between the charge switch 415 and the inductor 435.

A second diode 450 precedes the pulse capacitor 430 and pulse switch 455. The pulse switch 455 controls current to the load 460. A voltage measuring device 465 is used to monitor the voltage across the pulse capacitor 430.

Figure 5:
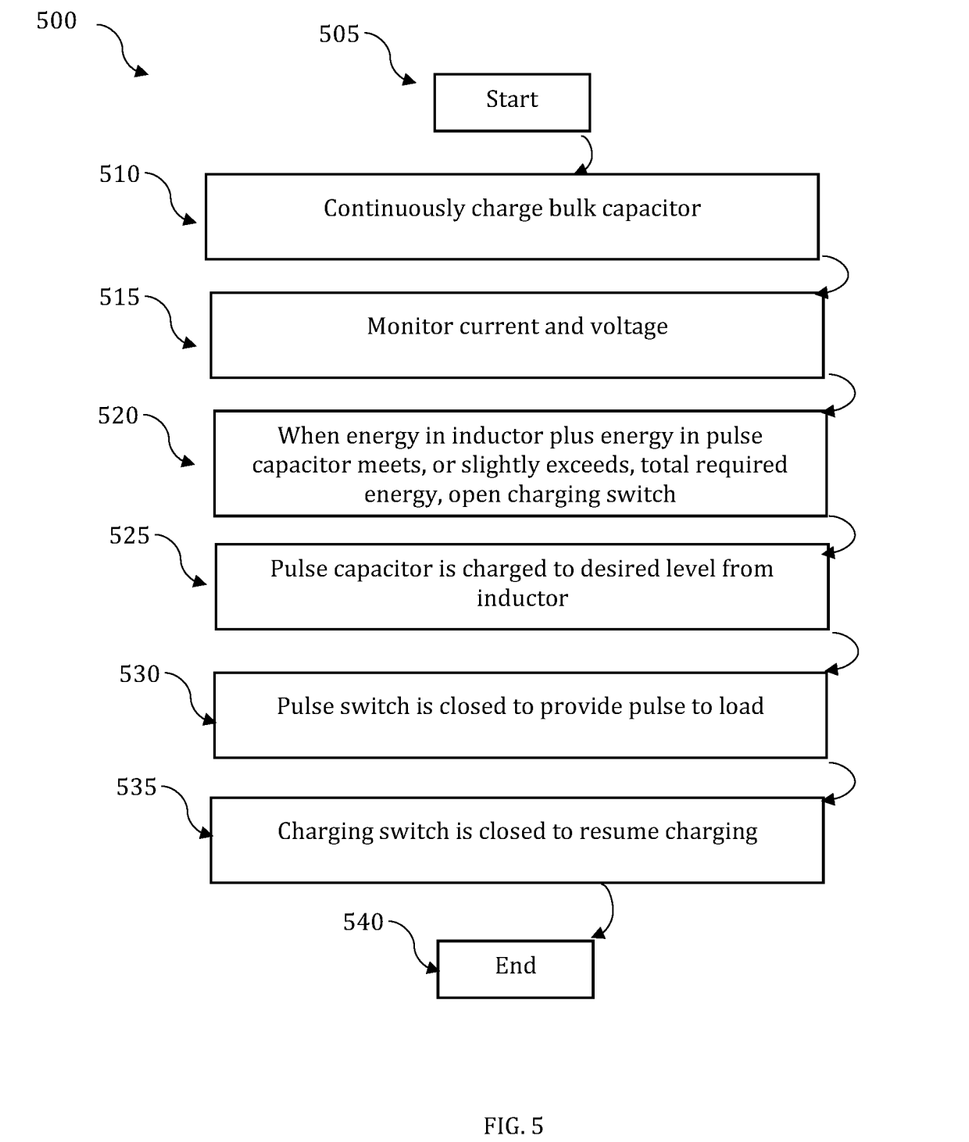
FIG. 5 depicts a flow chart of steps associated with a method for supplying charged pulses in accordance with the disclosed embodiments.

The predictive control technique is illustrated by the method 500 illustrated in FIG. 5, which refers to the system 400 components. The method begins at 505. In the predictive DeQing method illustrated in FIG. 5, an external charging supply 405 is used to continuously charge the bulk energy storage capacitor or capacitor bank 410 as shown at step 510. In order to charge the pulsed capacitor 430, the charging switch 415 can be closed.

The charge switch 415 can be disconnected from the bulk capacitor 410 and the freewheeling diode 420 then connects to other side of the pulse capacitor 430 before the standard resonant cycle is complete. At this point, no energy is provided from the bulk capacitor 410 to the pulse capacitor 430. Instead, the remaining energy is provided to the pulse capacitor 430 from the charging inductor 435 through the freewheeling diode 420.

A controller 470 can be used to monitor the readings from the current measuring device and voltage measuring device as shown at 515. In certain embodiments, the controller 470 can comprise software associated with a computer system 100. The controller 470 can be configured take readings and operate the charging switch 415 and pulse switch 455.

The controller 470 opens the charging switch 415 at the precise moment at which a real time calculation indicates that the energy in the inductor 435 added to the energy in the pulse capacitor 430 equals the desired energy level in the pulse capacitor as shown at 520. This relationship is given by equation (1):

$$\tfrac{1}{2} C\text{pulse}(V\text{meas})^2 + \tfrac{1}{2} L\text{charge}(I\text{meas})^2 = \tfrac{1}{2} C\text{pulse}(V\text{final})^2 \quad (1)$$

When the charging switch is opened, the inductor 435 completes the charging of the pulse capacitor 430 as shown at 525. As indicated at 530 the pulse switch 455 can be closed when a pulsed charge is required by load 460. Meanwhile the bulk capacitor 410 continues to charge from the power source 405. After the pulse switch 455 is opened, the controller 470 can close the charge switch 415 to begin recharging the pulse capacitor 430 and inductor 435 for the next pulsed discharge as shown at 535. The method ends at 540. The method 500 is unique in that transferring energy from the bulk capacitor 410 stops when the total energy required is stored in both the inductor 435 and the pulse capacitor 430.

The method 500 includes a number of advantages. For example, the method 500 is lossless (unlike prior art approaches in which excess energy in the charging inductor is dissipated in a resistor). The lossless approach allows for large variations in the bulk capacitor voltage during burst mode. Furthermore, the method 500 reduces the size and cost of the bulk capacitor bank and charging supply and reduces peak power drawn from the AC line. Large changes in bulk capacitor voltage without dissipating power are possible because a smaller bulk capacitor can have a substantial voltage droop during the burst, reducing size and cost.

Furthermore, method 500 allows for reduced peak power from the line. Specifically, the charging supply can operate during the whole time between bursts, recharging to the starting voltage just before the next burst, which also reduces size and cost. As a result, the power is drawn more evenly over the whole cycle. The method 500 thus reduces the peak power (and cost) required by letting the power supply charge over a longer time while still regulating the final load voltage accurately.

Figure 6:
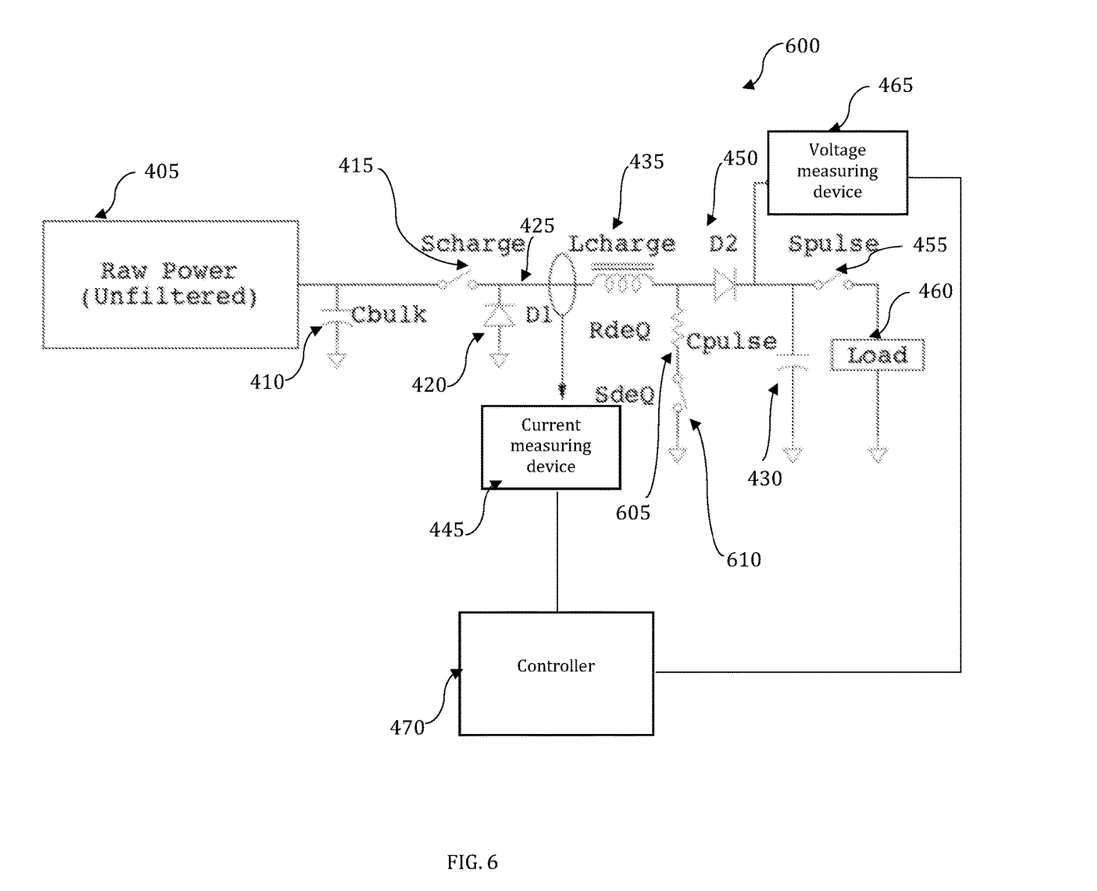
FIG. 6 depicts a block diagram of another embodiment of a system for supplying charged pulses in accordance with disclosed embodiments.

FIG. 6 illustrates a system 600 for predictive DeQ in accordance with another embodiment. It should be appreciated that many of the elements illustrated in system 400 are present in system 600, and like reference numerals for similar or identical elements are included throughout.

DeQ can be achieved predictively with a system 600. As shown in FIG. 6, power source 405 can provide power to a bulk capacitor or capacitor bank 410. It should be understood that the power source 405 can comprise any standard power source and can be unfiltered. In certain the embodiments, the power source 405 can comprise a standard DC power supply. In other embodiments, other power supplies can be used.

The bulk capacitor 410 comprises a passive energy storage component that is charged by the power source 405. In certain embodiments, the bulk capacitor can comprise a polarized capacitor with a capacitance that greatly exceeds that of the pulse capacitor 430. The bulk capacitor 410 is prevented from discharging by a charge switch 415.

A diode 420 connects a point 425 between the charge switch 415 and the inductor 435 to a point 440 after the pulse capacitor 435. Current measuring device 445 is used to monitor the current between the charge switch 415 and the inductor 435.

System 600 differs from system 400, in that system 600 includes a resistor 605 and switch 610 between the inductor 435 and second diode 450, that precedes the pulse capacitor 430 and pulse switch 455. In accordance with the embodiment, the energy determination made by the controller 470 can be modified slightly so that the charging switch 415 is not operated until the calculated energy is slightly above the required final energy level in the pulse capacitor 430. This accounts for imperfections in the system 600 by providing lossy DeQ when the voltage on the pulse capacitor 430 is at the exact desired level. Specifically, when the exact voltage on the pulse capacitor is met, the switch 610 can be closed so that any residual energy is dissipated in resistor 605. As with system 400, the pulse switch 455 controls current to the load 460.

Figure 7:
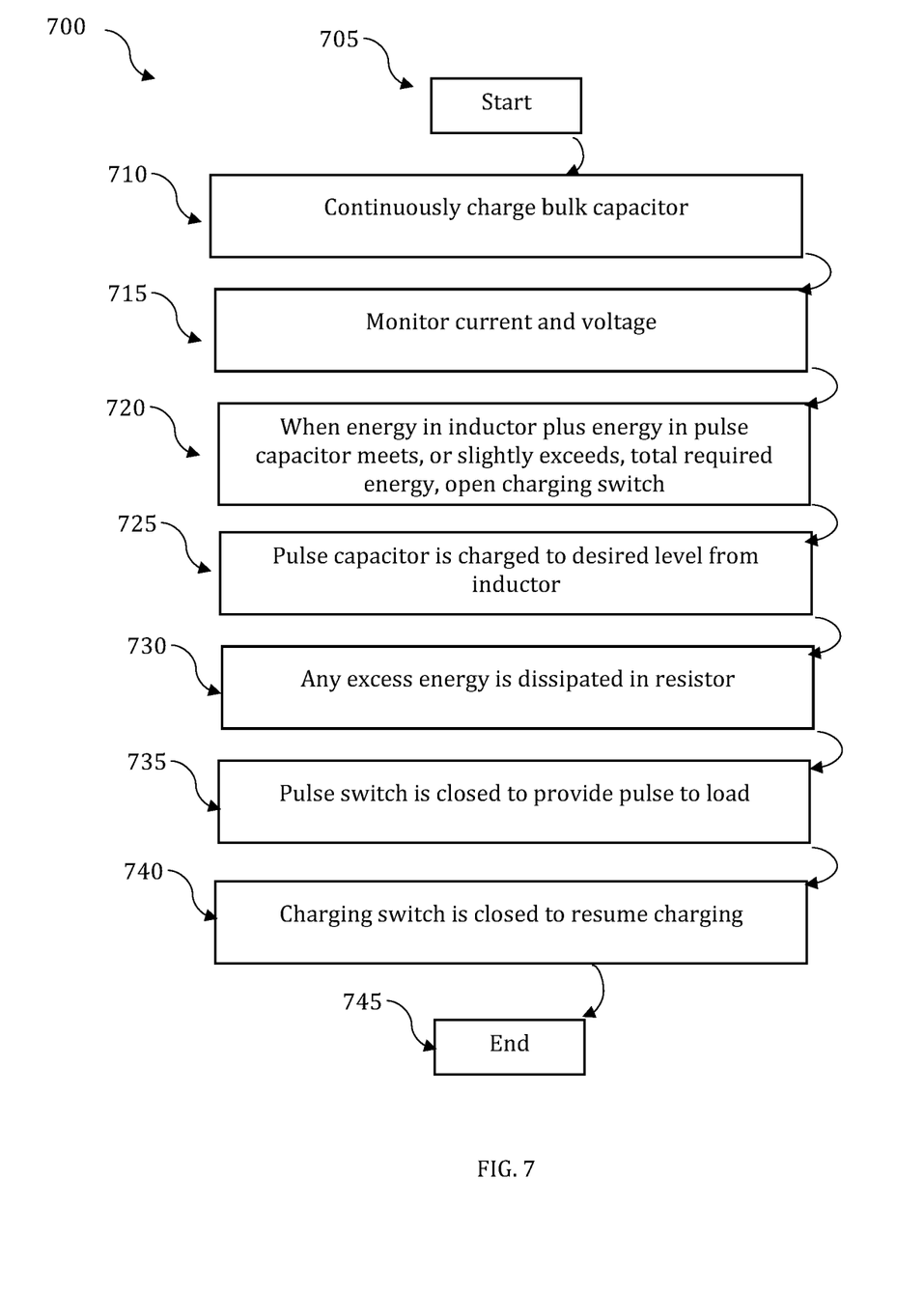
FIG. 7 depicts a flow chart of steps associated with another method for supplying charged pulses in accordance with the disclosed embodiments.

FIG. 7, illustrates a method 700 associated with "double DeQing" using the system 600 illustrated in FIG. 6. The method begins at 705. In the double DeQing method illustrated in FIG. 7, an external charging supply 405 is used to continuously charge the bulk energy storage capacitor or capacitor bank 410 as shown at step 710. In order to charge the pulsed capacitor 430, the charging switch 415 can be closed.

The charge switch 415 can stop current coming from the bulk capacitor 410 and then the freewheeling diode 420 allows current to continue in the charging inductor 435 before the standard resonant cycle is complete. At this point, no energy is provided from the bulk capacitor 410 to the pulse capacitor 430. Instead, the remaining energy provided to the pulse capacitor 430 is provided from the charging inductor 435.

A controller 470 can be used to monitor the readings from the current measuring device 445 and voltage measuring device 465 as shown at 715. In certain embodiments, the controller 470 can comprise software associated with a computer system 100. The controller 470 is further configured to operate the charging switch 415, pulse switch 455, and DeQing switch 610.

The controller 470 can open the charging switch 415 at the precise moment at which a real time calculation indicates that the energy in the inductor 435 added to the energy in the pulse capacitor 430 equals, or slightly exceeds, the desired energy level in the pulse capacitor as shown at 720. This relationship is given by equation (1).

When the charging switch is opened the inductor 435 continues the charging of the pulse capacitor 430 through the freewheeling diode 420 as shown at 725. Energy in excess of that required to charge the pulse capacitor can be dissipated in the resistor 605 by closing switch 610, as illustrated at 730. As indicated at 735, the pulse switch 455 can be closed when a pulsed charge is required by load 460. Meanwhile the bulk capacitor 410 continues to charge from the power source 405. After the pulse switch 455 is opened, the controller 470 can close the charge switch 415 to begin recharging the pulse capacitor 430 and inductor 435 for the next pulsed discharge as shown at 740. The method ends at 745.

Figure 8:
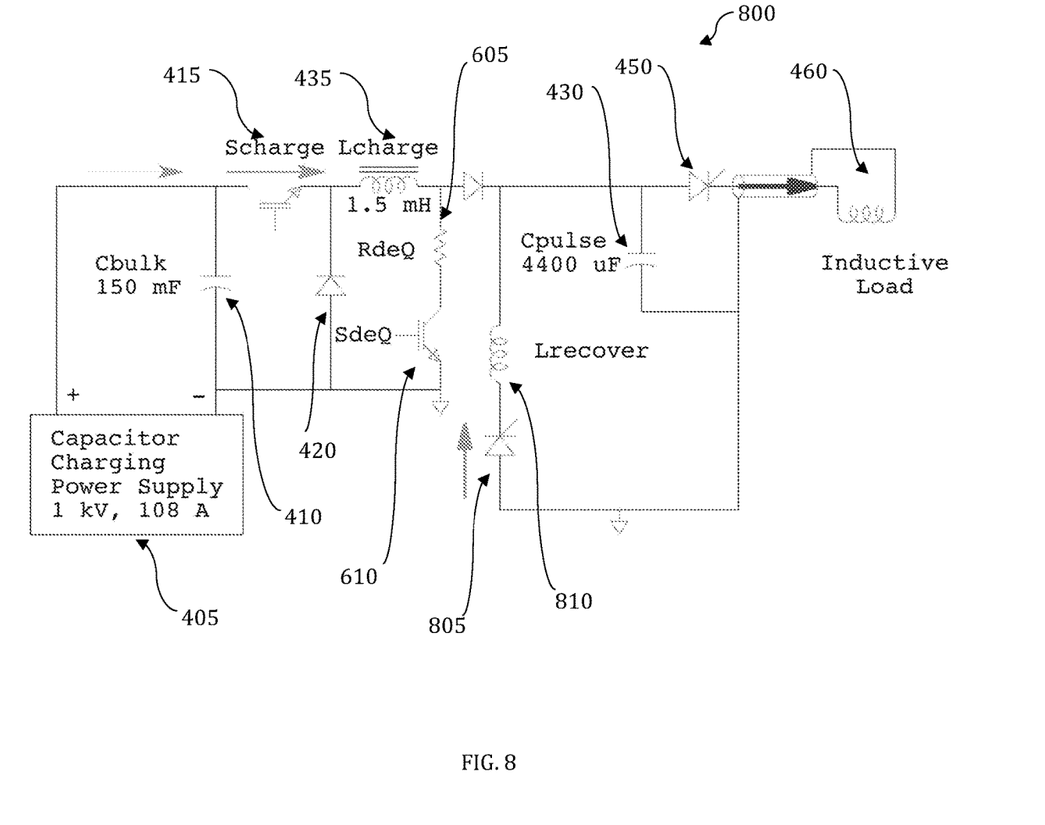
FIG. 8 depicts a block diagram of an exemplary embodiment of a system for supplying charged pluses in accordance with the disclosed embodiments.

FIG. 8, illustrates an exemplary system 800 for providing a pulsed charge to a load. It should be appreciated that certain elements in system 800 are the same elements illustrated in system 400 and system 600. Like reference numerals are used to identify like elements throughout.

As illustrated in FIG. 8, a power supply 405 can be used to charge a bulk capacitor or bulk capacitor bank 410. In certain embodiments the power supply can provide 1 kV at 108 amps, but other power supplies can also be used. The bulk capacitor 410 is connected to the inductor. The inductor can comprise a 1.5 mH inductor or other such inductor. The charge switch 415 controls energy flow to the inductor 435 and pulse capacitor 430. The pulse capacitor can comprise a 4400 uF capacitor, or other similarly sized capacitor, which is much small than the bulk capacitor 410. The system 800 includes resistor 605 where additional energy not required to charge pulse capacitor 430 can be dissipated via operation of switch 610.

Unique to system 800 is recovery inductor 810, which is connected to recovery switch 805. Closing the recovery switch reverses the voltage on the pulse capacitor when necessary. As in the other embodiments, the pulse capacitor 430 can supply power to the load 460, illustrated as an inductive load in this case.

Based on the foregoing, it can be appreciated that a number of embodiments, preferred and alternative, are disclosed herein. For example, in one embodiment a system comprises a bulk capacitor operably connected to a power source, an inductor connected to said bulk capacitor with a charge switch, a freewheeling diode connecting a point between said charge switch and said inductor to a point after said pulse capacitor, a pulse capacitor connected to said inductor with a second diode, and a pulse switch connecting said pulse capacitor to a load.

In an embodiment, the system further comprises a current measurement device configured to measure a current between said charge switch and said inductor and a voltage measurement device configured to measure a voltage across said pulse capacitor. The system further comprises a regulator configured to receive said current measurement from said current measuring device and said voltage measurement from said voltage measurement device, and operate said charge switch according to a resonant cycle. In an embodiment the charge switch operation occurs when an energy in said inductor, added to an energy in said pulse capacitor, equals a total desired energy in said pulse capacitor.

In an embodiment, the system further comprises a second inductor and a recovery switch wherein operating said recovery switch reverses a voltage on said pulse capacitor.

In an embodiment, the system further comprises a resistor following said inductor and a DeQ switch configured after said resistor. The system further comprises a current measurement device configured to measure a current between said charge switch and said inductor and a voltage measurement device configured to measure a voltage across said pulse capacitor. The system further comprises a regulator wherein said charge switch operation occurs when an energy in said inductor, added to an energy in said pulse capacitor, is more than a total desired energy in said pulse capacitor. In an embodiment the DeQ switch operation occurs when said measured voltage on said pulse capacitor is equal to a desired voltage on said pulse capacitor.

In an embodiment, the system further comprises an application requiring a pulsed input.

In an embodiment, an apparatus comprises a bulk capacitor operably connected to a power source, an inductor connected to said bulk capacitor with a charge switch, a current measurement device configured to measure a current between said charge switch and said inductor, a voltage measurement device configured to measure a voltage across said pulse capacitor, a freewheeling diode connecting a point between said charge switch and said inductor to a point after said pulse capacitor, a pulse capacitor connected to said inductor with a second diode, a pulse switch connecting said pulse capacitor to a load, and a regulator configured to receive said current measurement from said current measuring device and said voltage measurement from said voltage measurement device, and operate said charge switch.

In an embodiment, the charge switch operation occurs when an energy in said inductor, added to an energy in said pulse capacitor, equals a total desired energy in said pulse capacitor.

In an embodiment, the apparatus further comprises a resistor following said inductor and a DeQ switch configured after said resistor. The DeQ switch operation occurs when said measured voltage on said pulse capacitor is equal to a desired voltage on said pulse capacitor.

In an embodiment a method comprises charging a bulk capacitor with a power source, connecting said bulk capacitor to an inductor with a charge switch, charging a pulse capacitor connected to said inductor wherein a sum of energy in said pulse capacitor and energy in said inductor equals a desired energy, and providing energy in said pulse capacitor to a load with a pulse switch.

In an embodiment the method further comprises measuring a current between said charge switch and said inductor with a current measurement device and measuring a voltage across said pulse capacitor with a voltage measurement device. The method further comprises receiving said current measurement from said current measurement device and said voltage measurement from said voltage measurement device and operating said charge switch when an energy in said inductor, added to an energy in said pulse capacitor, equals a total desired energy in said pulse capacitor.

In an embodiment the method further comprises dissipating additional energy in a resistor following said inductor via operation of a DeQ switch. The DeQ switch operation occurs when said measured voltage on said pulse capacitor is equal to a desired voltage on said pulse capacitor.

In an embodiment the load further comprises an application requiring a pulsed input.

It will be appreciated that variations of the above-disclosed and other features and functions, or alternatives thereof, may be desirably combined into many other different systems or applications. Also, it should be understood that various presently unforeseen or unanticipated alternatives, modifications, variations or improvements therein may be subsequently made by those skilled in the art which are also intended to be encompassed by the following claims.

What is claimed is:

1. A system comprising:
   a bulk capacitor operably connected to a power source;
   an inductor connected to said bulk capacitor with a charge switch;
   a pulse capacitor connected to said inductor in series with a second diode wherein said bulk capacitor charges said inductor and said pulse capacitor when said charge switch is closed;
   a regulator configured to open said charge switch at a point in time when a first energy stored in said inductor added to a second energy stored in said pulse capacitor equals a total energy required to be delivered as a pulsed discharge to a load;
   a resistor configured between said inductor and a DeQ switch, wherein said DeQ switch can be closed to dissipate the first energy excess in said inductor;
   a recovery inductor;
   a recovery switch wherein operating said recovery switch reverses voltage on said pulse capacitor;
   a freewheeling diode connecting a point between said charge switch and said inductor to a point after said pulse capacitor; and
   a pulse switch connecting said pulse capacitor to said load, wherein closing said pulse switch provides said pulsed discharge to said load.

2. The system of claim 1 further comprising:
   a current measurement device configured to measure a current between said charge switch and said inductor; and
   a voltage measurement device configured to measure a voltage across said pulse capacitor.

3. The system of claim 2 wherein said regulator is further configured to receive said current measurement from said current measuring device and said voltage measurement from said voltage measurement device, and close said charge switch after said pulsed discharge in order to recharge said pulse capacitor, according to a resonant cycle.

4. The system of claim 1 wherein a first capacitance of the bulk capacitor is greater than a second capacitance of the pulse capacitor.

5. The system of claim 1 further comprising:
a current measurement device configured to measure a current between said charge switch and said inductor; and
a voltage measurement device configured to measure a voltage across said pulse capacitor.

6. The system of claim 5 wherein said regulator controls said DeQ switch operation.

7. The system of claim 6 wherein said DeQ switch operation occurs when said measured voltage on said pulse capacitor is equal to a desired voltage on said pulse capacitor.

8. The system of claim 1 wherein said load further comprises an application requiring a pulsed input.

9. An apparatus comprising:
a bulk capacitor comprising a bulk capacitor bank, operably connected to a power source;
an inductor connected to said bulk capacitor with a charge switch;
a current measurement device configured to measure a current between said charge switch and said inductor;
a pulse capacitor connected to said inductor with a second diode, wherein said bulk capacitor charges said inductor and said pulse capacitor when said charge switch is closed;
a voltage measurement device configured to measure a voltage across said pulse capacitor;
a regulator configured to receive an input from said current measurement device and to receive an input from said voltage measurement device, and open said charge switch at a point in time when a first energy stored in said inductor added to a second energy stored in said pulse capacitor equals a total energy required to be delivered as a pulsed discharge to a load;
a resistor configured between said inductor and a DeQ switch, wherein said DeQ switch can be closed to dissipate the first energy excess in said inductor;
a recovery inductor;
a recovery switch wherein operating said recovery switch reverses voltage on said pulse capacitor;
a freewheeling diode connecting a point between said charge switch and said inductor to a point after said pulse capacitor; and
a pulse switch connecting said pulse capacitor to said load, wherein closing said pulse switch provides said pulsed discharge to said load.

10. The apparatus of claim 9, wherein a first capacitance of the bulk capacitor comprising a bulk capacitor bank, is greater than a second capacitance of the pulse capacitor.

11. The apparatus of claim 9 wherein said load comprises an inductive load.

12. The apparatus of claim 11 wherein said DeQ switch operation occurs when said measured voltage on said pulse capacitor is equal to a desired voltage on said pulse capacitor.

13. A method comprising:
charging a bulk capacitor with a power source;
connecting said bulk capacitor to an inductor and a pulse capacitor with a charge switch;
charging said pulse capacitor and said inductor when said charge switch is closed;
opening said charge switch at a point in time when a first energy stored in said inductor added to a second energy stored in said pulse capacitor equals a total energy required to be delivered as a pulsed discharge to a load;
dissipating the first energy excess in said inductor with a resistor by closing a DeQ switch, wherein said resistor is configured between said inductor and said DeQ switch;
reversing voltage on said pulse capacitor by operating a recovery switch connected to a recovery inductor; and
closing a pulse switch connecting said pulse capacitor to said load on a resonant cycle.

14. The method of claim 13 further comprising:
measuring a current between said charge switch and said inductor with a current measurement device; and
measuring a voltage across said pulse capacitor with a voltage measurement device.

15. The method of claim 14 further comprising:
receiving said current measurement from said current measurement device and said voltage measurement from said voltage measurement device at a regulator, said regulator being configured to operate said charge switch.

16. The method of claim 13 wherein said DeQ switch operation occurs when said measured voltage on said pulse capacitor is equal to a desired voltage on said pulse capacitor.

17. The method of claim 15 wherein said load further comprises an application requiring a pulsed input.

* * * * *